(12) United States Patent
Wang et al.

(10) Patent No.: US 8,804,874 B2
(45) Date of Patent: Aug. 12, 2014

(54) POLAR TRANSMITTER HAVING DIGITAL PROCESSING BLOCK USED FOR ADJUSTING FREQUENCY MODULATING SIGNAL FOR FREQUENCY DEVIATION OF FREQUENCY MODULATED CLOCK AND RELATED METHOD THEREOF

(75) Inventors: Chi-Hsueh Wang, Kaohsiung (TW); Kai-Peng Kao, Hsinchu (TW); Robert Bogdan Staszewski, Delft (NL)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/612,796

(22) Filed: Sep. 12, 2012

(65) Prior Publication Data

US 2013/0188749 A1    Jul. 25, 2013

Related U.S. Application Data

(60) Provisional application No. 61/589,031, filed on Jan. 20, 2012.

(51) Int. Cl.
*H03C 3/00* (2006.01)

(52) U.S. Cl.
USPC ............ 375/302; 375/300; 375/298; 375/303

(58) Field of Classification Search
USPC .................................. 375/302, 300, 298, 303
See application file for complete search history.

(56) References Cited

U.S. PATENT DOCUMENTS

| | | | |
|---|---|---|---|
| 7,777,576 B2 | 8/2010 | Waheed | |
| 8,634,512 B2 | 1/2014 | Leung | |
| 2008/0002788 A1* | 1/2008 | Akhtar et al. | 375/298 |
| 2008/0309524 A1* | 12/2008 | Syllaios et al. | 341/61 |
| 2008/0317187 A1 | 12/2008 | Waheed | |

\* cited by examiner

*Primary Examiner* — Kabir A Timory
(74) *Attorney, Agent, or Firm* — Winston Hsu; Scott Margo

(57) ABSTRACT

A polar transmitter includes a frequency modulating path, a clock divider and a digital processing block. The frequency modulating path is arranged for generating a frequency modulated clock in response to a frequency modulating signal. The clock divider is coupled to the frequency modulated clock, and arranged for generating a down-divided clock. The digital processing block is coupled to the down-divided clock, and arranged for generating the frequency modulating signal, wherein the frequency modulating signal is adjusted for frequency deviation of the frequency modulated clock. A method for polar transmission includes: generating a frequency modulated clock in response to a frequency modulating signal; dividing a frequency of said frequency modulated clock to generate a down-divided clock; and generating said frequency modulating signal according to said down-divided clock, wherein said frequency modulating signal is adjusted for frequency deviation of said frequency modulated clock.

24 Claims, 9 Drawing Sheets

US 8,804,874 B2

POLAR TRANSMITTER HAVING DIGITAL PROCESSING BLOCK USED FOR ADJUSTING FREQUENCY MODULATING SIGNAL FOR FREQUENCY DEVIATION OF FREQUENCY MODULATED CLOCK AND RELATED METHOD THEREOF

CROSS REFERENCE TO RELATED APPLICATIONS

This application claims the benefit of U.S. provisional application No. 61/589,031, filed on Jan. 20, 2012 and incorporated herein by reference.

BACKGROUND

The disclosed embodiments of the present invention relate to mitigating frequency deviation effects caused by a variable-rate clock, and more particularly, to a polar transmitter having a digital processing block used for adjusting a frequency modulating signal for frequency deviation of a frequency modulated clock and a related method thereof.

A digital polar transmitter offers some advantages, such as a potential for reducing complexity and current consumption in the modulator path as well as eliminating the problem of image rejection, thus the polar transmitter is more suitable for implementation in advanced complementary metal oxide semiconductor (CMOS) processing technologies. More specifically, the digital polar transmitter is a transmitting device that splits a complex baseband signal explicitly represented by an amplitude-modulated (AM) contented component and a phase-modulated (PM) contented component, instead of an in-phase component and a quadrature component. These two components are then recombined into a radio-frequency (RF) output to be transmitted over the air. For example, an all-digital phase locked loop (ADPLL) may be disposed in a frequency modulating path to generate a frequency modulated clock, such as a clock output of a digitally-controlled oscillator (DCO), in response to the PM contented component, and the frequency/phase modulated clock is processed by a following stage such as a digitally-controlled power amplifier (DPA).

In the digital polar transmitter, almost all variable-rate and fixed-rate clocks (except for the frequency reference, FREF, clock, of course) are generally obtained by edge-division of the frequency modulated clock (e.g., a DCO clock). More specifically, to save area and power, there is no dedicated fixed-rate PLL used for the generation of high-frequency clocks. Since the DCO undergoes FM data modulation, all the derived integer-divided clocks will experience time-variant instantaneous frequency perturbations. In other words, any clock derived from performing frequency division upon the DCO clock would have a time-variant clock frequency due to the FM data modulation. The transmitter (TX) circuits normally assume time-invariant clock frequencies, therefore certain operations may be affected when the clocks actually have time-variant clock frequencies. One solution may run a clock divider at a high clock rate to compensate the frequency deviation effect and create a clean clock. However, this is power and area consuming, and is not applicable for resource-limited applications.

Thus, there is a need for an innovative design, which is capable of effectively compensating the frequency deviation effect by using simple digital signal processing means.

SUMMARY

In accordance with exemplary embodiments of the present invention, a polar transmitter having a digital processing block used for adjusting a frequency modulating signal for frequency deviation of a frequency modulated clock and a related method thereof are proposed to solve the above-mentioned problems.

According to a first aspect of the present invention, an exemplary polar transmitter is disclosed. The exemplary polar transmitter includes a frequency modulating path, a clock divider and a digital processing block. The frequency modulating path is arranged for generating a frequency modulated clock in response to a frequency modulating signal. The clock divider is coupled to the frequency modulated clock, and arranged for generating a down-divided clock. The digital processing block is coupled to the down-divided clock, and arranged for generating the frequency modulating signal, wherein the frequency modulating signal is adjusted for frequency deviation of the frequency modulated clock.

According to a second aspect of the present invention, an exemplary method for polar transmission is provided. The exemplary method includes: generating a frequency modulated clock in response to a frequency modulating signal; dividing a frequency of said frequency modulated clock to generate a down-divided clock; and generating said frequency modulating signal according to said down-divided clock, wherein said frequency modulating signal is adjusted for frequency deviation of said frequency modulated clock.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
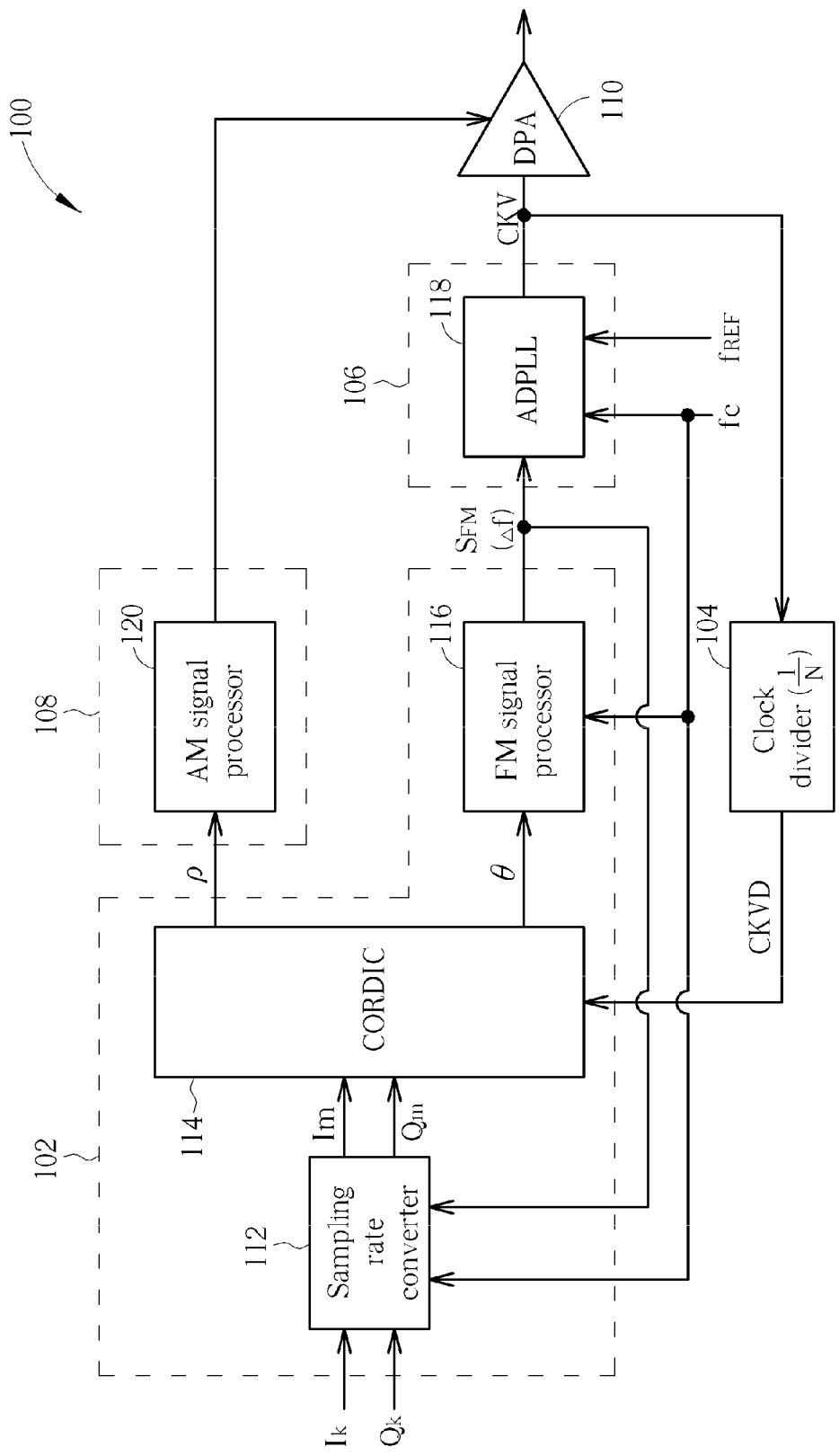
FIG. 1 is a block diagram illustrating a polar transmitter according to an embodiment of the present invention.

FIG. 1 is a block diagram illustrating a polar transmitter according to an embodiment of the present invention. By way of example, the polar transmitter 100 may be a multi-rate wideband transmitter. The polar transmitter 100 includes a digital processing block 102, a clock divider 104, a frequency modulating path 106, an amplitude modulating path 108 and a DPA 110. The frequency modulating path 106 is arranged for generating a frequency modulated clock CKV ("V" stands for variable) in response to a frequency modulating signal $S_{FM}$. In this embodiment, an ADPLL 118 is disposed in the frequency modulating path 106, and is configured to operate according to the frequency modulating signal $S_{FM}$, a carrier frequency $f_c$ (e.g., 2.454 GHz) and a reference frequency $f_{REF}$ (e.g., 26 MHz). Thus, the frequency of the frequency modulated clock CKV (i.e., DCO clock) is time-variant and falls within a range of e.g., 2.454 GHz-26 MHz to 2.454 GHz+26 MHz. It should be noted that the actual peak frequency deviation (e.g., +/−26 MHz) may depend on the sampling frequency of the CORDIC 114. Regarding the exemplary circuit structure shown in FIG. 1, if the CORDIC rate is 50 MHz, for example, then the peak frequency deviation may be 25 MHz, which is one-half of the CORDIC sampling frequency. The clock divider 104 is coupled between the frequency modulating path 106 and the digital processing block 102, and arranged for performing frequency division upon the frequency modulated clock CKV to generate a down-divided variable clock CKVD to the digital processing block 102. For example, the clock divider 104 may be configured to perform the frequency division by a power-of-two number (e.g., $N=2^n$, where n is an integer). The digital processing block 102 is arranged for generating the frequency modulating signal $S_{FM}$, wherein the frequency modulating signal $S_{FM}$ is adjusted for frequency deviation $\Delta f$ effects of the frequency modulated clock CKV. As shown in FIG. 1, the digital processing block 102 includes a sampling rate converter 112, a coordinate rotation digital computer (CORDIC) 114 and an FM signal processor 116, wherein the down-divided clock CKVD acts as an operating clock of the CORDIC 114.

The CORDIC 114 is a digital signal processor arranged for converting an in-phase component $I_m$ and a quadrature component $Q_m$ into a phase component $\theta$ and an amplitude component $\rho$. In this embodiment, the sampling rate converter 112 is arranged for performing interpolation upon an in-phase component $I_k$ and a quadrature component $Q_k$ with a fixed clock rate (e.g., 16 MHz or 32 MHz) into the in-phase component $I_m$ and the quadrature component $Q_m$ with a variable clock rate. Regarding the clock divider 104, it employs a fixed frequency division factor N which is set based on the desired variable clock rate of the in-phase component $I_m$ and the quadrature component $Q_m$. Assuming that the carrier frequency $f_c$ is 2.454 GHz, the frequency division factor N is set by 48 if the fixed clock rate of the in-phase component $I_k$ and the quadrature component $Q_k$ is 32 MHz, and the frequency division factor N is set by 96 if the fixed clock rate of the in-phase component $I_k$ and the quadrature component $Q_k$ is 16 MHz. The FM signal processor 116 is arranged for converting the phase component $\theta$ into the frequency deviation $\Delta f$ by a difference operator $1-z^{-1}$ and a scaling factor $f_c/96$, and accordingly generating the frequency modulating signal $S_{FM}$.

It should be noted that over-sampling may also be involved in the calculation of frequency deviation $\Delta f$. As shown in FIG. 1, an AM signal processor 120 is disposed in the amplitude modulating path 108, and is arranged for processing the amplitude component $\rho$ generated from the CORDIC 114 to generate an amplitude control word to the DPA 110. Hence, based on the amplitude control word generated from the AM signal processor 120 and the frequency modulated clock CKV generated from the ADPLL 118, an RF output is generated from the DPA 110.

As the CORDIC 114 operates according to a variable-rate clock CKVD derived from the frequency modulated clock CKV, both of the amplitude modulating path 108 and the frequency modulating path 106 are coupled to the frequency modulated clock CKV, and may be affected by frequency deviation $\Delta f$ the frequency modulated clock CKV. To compensate the frequency deviation, the digital processing block 102 adjusts the frequency modulating signal $S_{FM}$ by performing an interpolation from a fixed frequency clock (e.g., 16/32 MHz) to the down-divided variable clock CKVD (e.g., 51.25 MHZ+/−0.542 MHz). In this embodiment, the frequency modulating signal $S_{FM}$ is adjusted through the sampling rate converter 112 to compensate the frequency deviation $\Delta f$ the frequency modulated clock CKV. Specifically, the sampling rate converter 112 employs a simplified digital correction algorithm to dynamically calculate the required compensation and interpolate the in-phase and quadrature data according to the frequency deviation. Though the CORDIC 114 operates according to the variable-rate clock CKVD, the frequency deviation is compensated by the sampling rate converter 112. Hence, the CORDIC 114 may be regarded as if operating under a fixed-rate clock.

Figure 2:
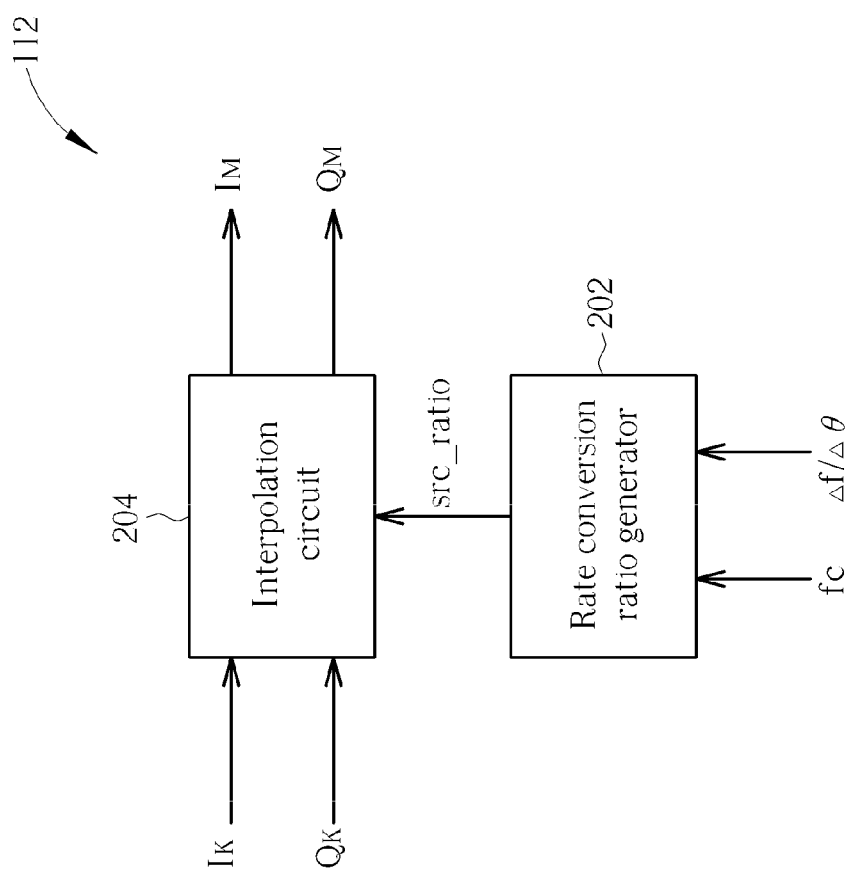
FIG. 2 is a block diagram illustrating an exemplary implementation of the sampling rate converter shown in FIG. 1.

Please refer to FIG. 2, which is a block diagram illustrating an exemplary implementation of the sampling rate converter 112 shown in FIG. 1. The sampling rate converter 112 includes a rate conversion ratio generator 202 and an interpolation circuit 204. The rate conversion ratio generator 202 is arranged for receiving the carrier frequency $f_c$ and the instantaneous value of the frequency deviation $\Delta f$ the frequency modulated clock CKV, and dynamically adjusting/updating a rate conversion ratio src_ratio according to the carrier frequency $f_c$ and the frequency deviation $\Delta f$. It should be noted that the frequency deviation $\Delta f$ results from the phase deviation $\Delta\theta$. Hence, one skilled in the pertinent art should readily appreciate that the rate conversion ratio generator 202 may be modified to operate according to the carrier frequency $f_c$ and the instantaneous value of the phase deviation $\Delta\theta$ of the frequency modulated clock CKV. In other words, the rate conversion ratio src_ratio is a time-variant value. The interpolation circuit 204 is coupled to the rate conversion ratio generator 202, and acts as a variable interpolator arranged for performing variable interpolation upon the in-phase component $I_k$ and quadrature component $Q_k$ according to an accumulation (i.e., $\alpha$) of the rate conversion ratio src_ratio, and accordingly generating the in-phase component $I_m$ and quadrature component $Q_m$ to the following CORDIC 114 for further processing, where $$I_m = (I_k - I_{k-1})*\alpha + I_{k-1}, Q_m = (Q_k - Q_{k-1})*\alpha + Q_{k-1}, \text{ and}$$

$$\alpha = \sum_{n=0}^{k} \text{src\_ratio}_n.$$

In a case where the carrier frequency $f_c$ is 2.454 GHz and the fixed clock rate of the in-phase component $I_k$ and the quadrature component $Q_k$ is 32 MHz, the frequency division factor N would be set by 48. Hence, the rate conversion ratio src_ratio may be simply derived from the following equation.

$$\text{src\_ratio} = \frac{32 \text{ MHz}}{(f_c + \Delta f)/48} \quad (1)$$

In another case where the carrier frequency $f_c$ is 2.454 GHz and the fixed clock rate of the in-phase component $I_k$ and the quadrature component $Q_k$ is 16 MHz, the frequency division factor N would be set by 96. Hence, the rate conversion ratio src_ratio may be simply derived from the following equation.

$$\text{src\_ratio} = \frac{16 \text{ MHz}}{(f_c + \Delta f)/96} \quad (2)$$

To simply the computation effort by using multiplication operators, the above equations (1) may be reformulated as below.

$$\begin{aligned}
\text{src\_ratio} &= \frac{32 \text{ MHz}}{(f_c + \Delta f)/48} \quad (3a) \\
&= \frac{32 \text{ MHz} \times 48}{f_c} \cdot \frac{1}{1 + \Delta f/f_c} \\
&\cong \frac{1536 \text{ MHz}}{f_c}\left(1 - \frac{\Delta f}{f_c}\right) \\
&= [LUT'(f_c) + const']\left(1 - \frac{\Delta f}{f_c}\right) \\
&= [LUT'(f_c) + const'] - \left[LUT'(f_c) \times \frac{\Delta f}{f_c} + const' \times \frac{\Delta f}{f_c}\right]
\end{aligned}$$

If using $\Delta\theta$ instead of $\Delta f$, the equation can be listed as below.

$$\begin{aligned}
\text{src\_ratio} &= \frac{32 \text{ MHz}}{(f_c + \Delta f)/48} \quad (3b) \\
&= \frac{32 \text{ MHz} \times 48}{f_c + \Delta\theta \times f_c/96} \\
&= \frac{32 \text{ MHz} \times 48}{f_c} \cdot \frac{1}{1 + \Delta\theta/96} \\
&\cong \frac{1536 \text{ MHz}}{f_c}\left(1 - \frac{\Delta\theta}{96}\right) \\
&= [LUT(f_c) + const]\left(1 - \frac{\Delta\theta}{96}\right) \\
&= [LUT(f_c) + const] - \left[LUT(f_c) \times \frac{\Delta\theta}{96} + const \times \frac{\Delta\theta}{96}\right]
\end{aligned}$$

where $\Delta\theta = 2 \times 48 \times \Delta f/f_c$, and $-1 \leq \Delta\theta \leq 1$.

For equation (2), it may be reformulated as below $$\begin{aligned}
\text{src\_ratio} &= \frac{16 \text{ MHz}}{(f_c + \Delta f)/96} \quad (4) \\
&= \frac{16 \text{ MHz} \times 96}{f_c + \Delta\theta \times f_c/192}
\end{aligned}$$

-continued $$\begin{aligned}
&= \frac{16 \text{ MHz} \times 96}{f_c} \cdot \frac{1}{1 + \Delta\theta/192} \\
&\cong \frac{1536 \text{ MHz}}{f_c}\left(1 - \frac{\Delta\theta}{192}\right) \\
&= [LUT(f_c) + const]\left(1 - \frac{\Delta\theta}{192}\right) \\
&= [LUT(f_c) + const] - \left[LUT(f_c) \times \frac{\Delta\theta}{192} + const \times \frac{\Delta\theta}{192}\right]
\end{aligned}$$

Figure 3:
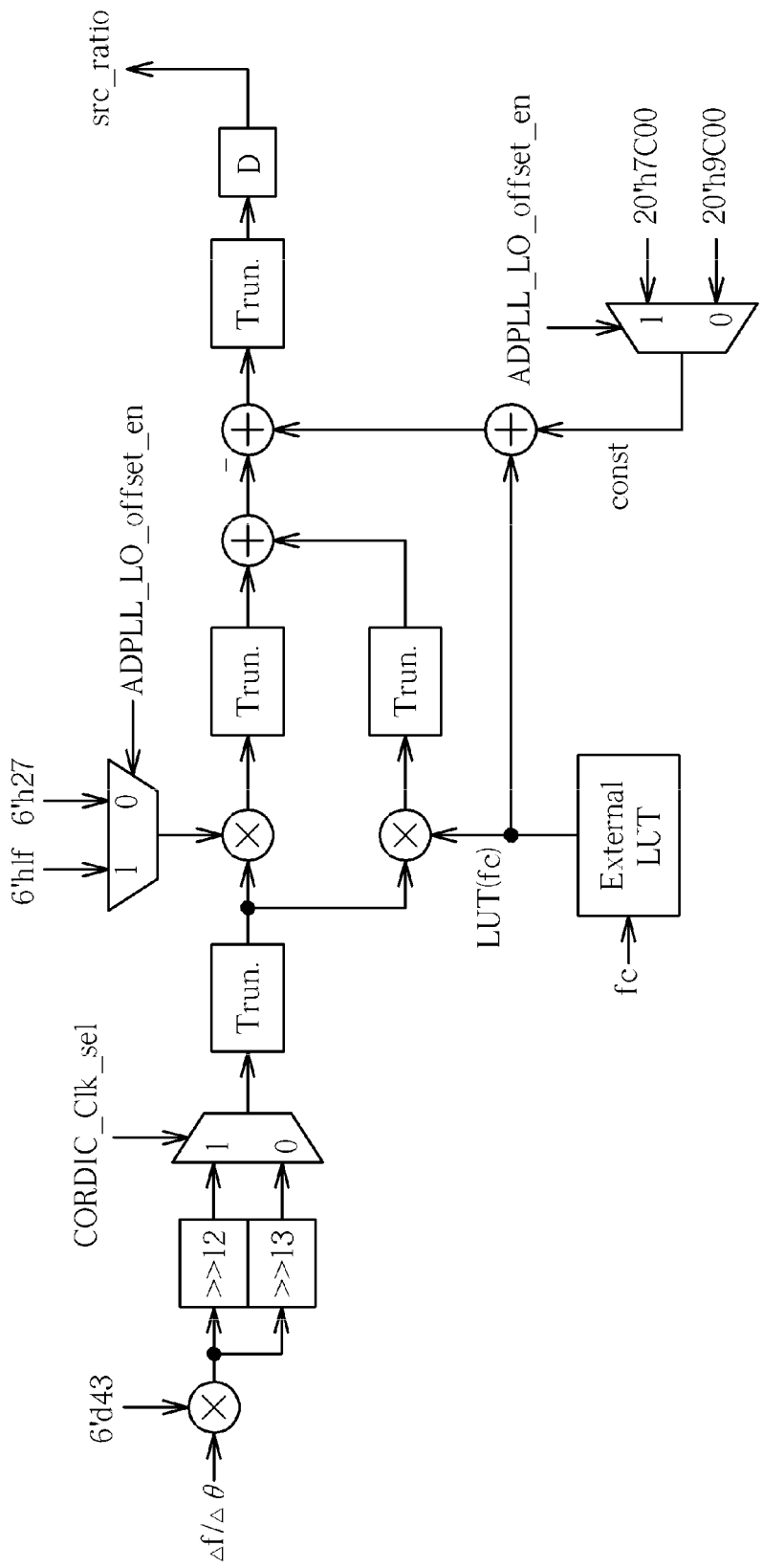
FIG. 3 is a diagram illustrating an exemplary circuit implementation of the rate conversion ratio generator 202 shown in FIG. 2.
Figure 4:
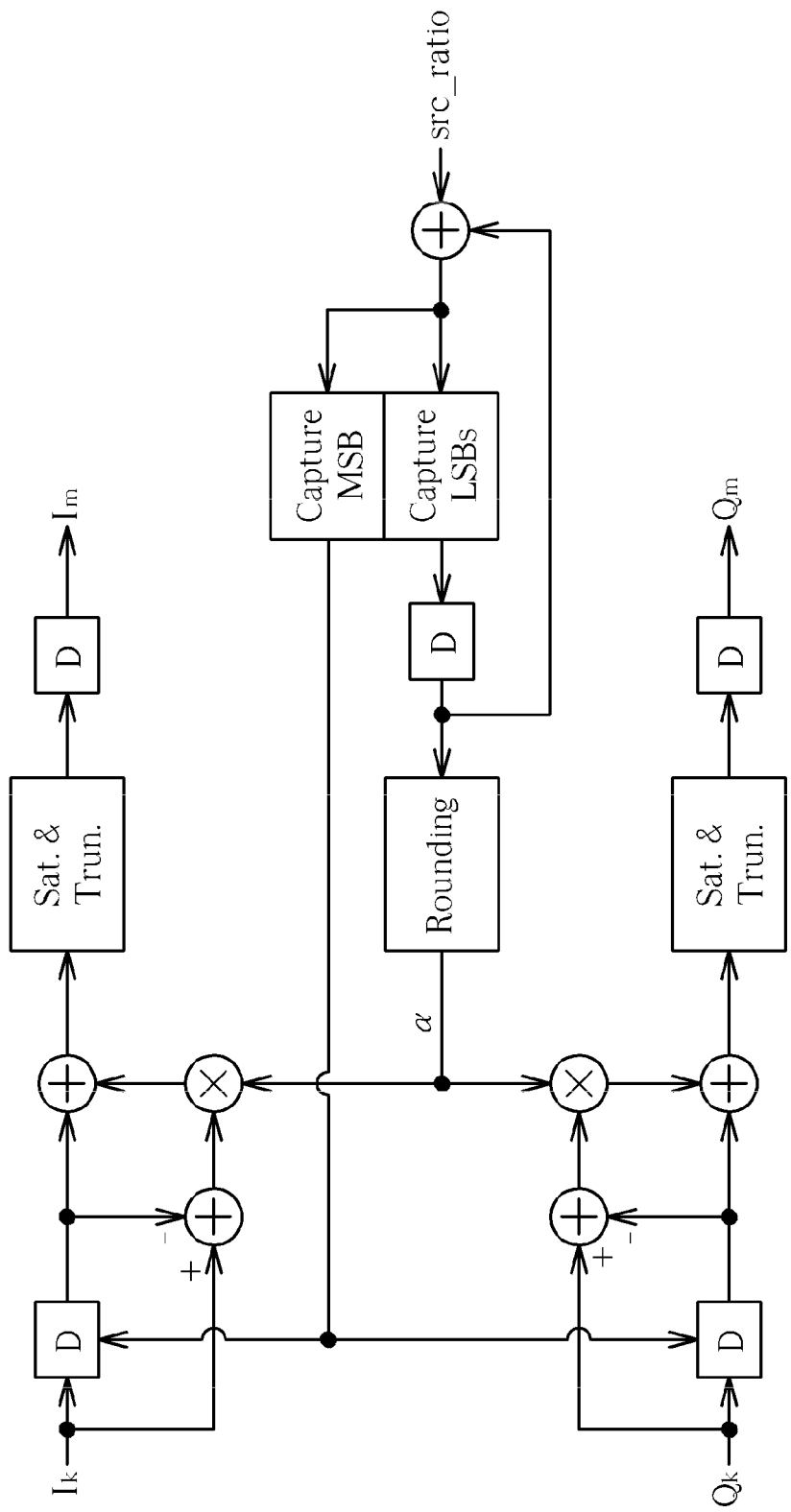
FIG. 4 is a diagram illustrating an exemplary circuit implementation of the interpolation circuit shown in FIG. 2.

Therefore, the rate conversion ratio src_ratio can be obtained by searching a look-up table (LUT) for a predefined value indexed by $f_c$ (i.e., LUT($f_c$)) and selecting a proper constant value (i.e., const). Exemplary circuit implementations of the rate conversion ratio generator 202 and the interpolation circuit 204 using equation (3b) and (4) are shown in FIG. 3 and FIG. 4, respectively, where the phase deviation $\Delta\theta$, instead of the frequency deviation $\Delta f$, is used for obtaining the rate conversion ratio src_ratio. As mentioned above, the frequency deviation $\Delta f$ results from the phase deviation $\Delta\theta$. Alternatively, with proper modification of the exemplary circuit shown in FIG. 3, using the frequency deviation $\Delta f$ to obtain the rate conversion ratio src_ratio is feasible. By way of example, the interpolators (i.e., the top-left circuit and bottom-left circuit of FIG. 4) may be implemented using linear interpolators each operated according to a weighting factor $\alpha$, which is derived from rounding an accumulation of the rate conversion ratio src_ratio.

Figure 5:
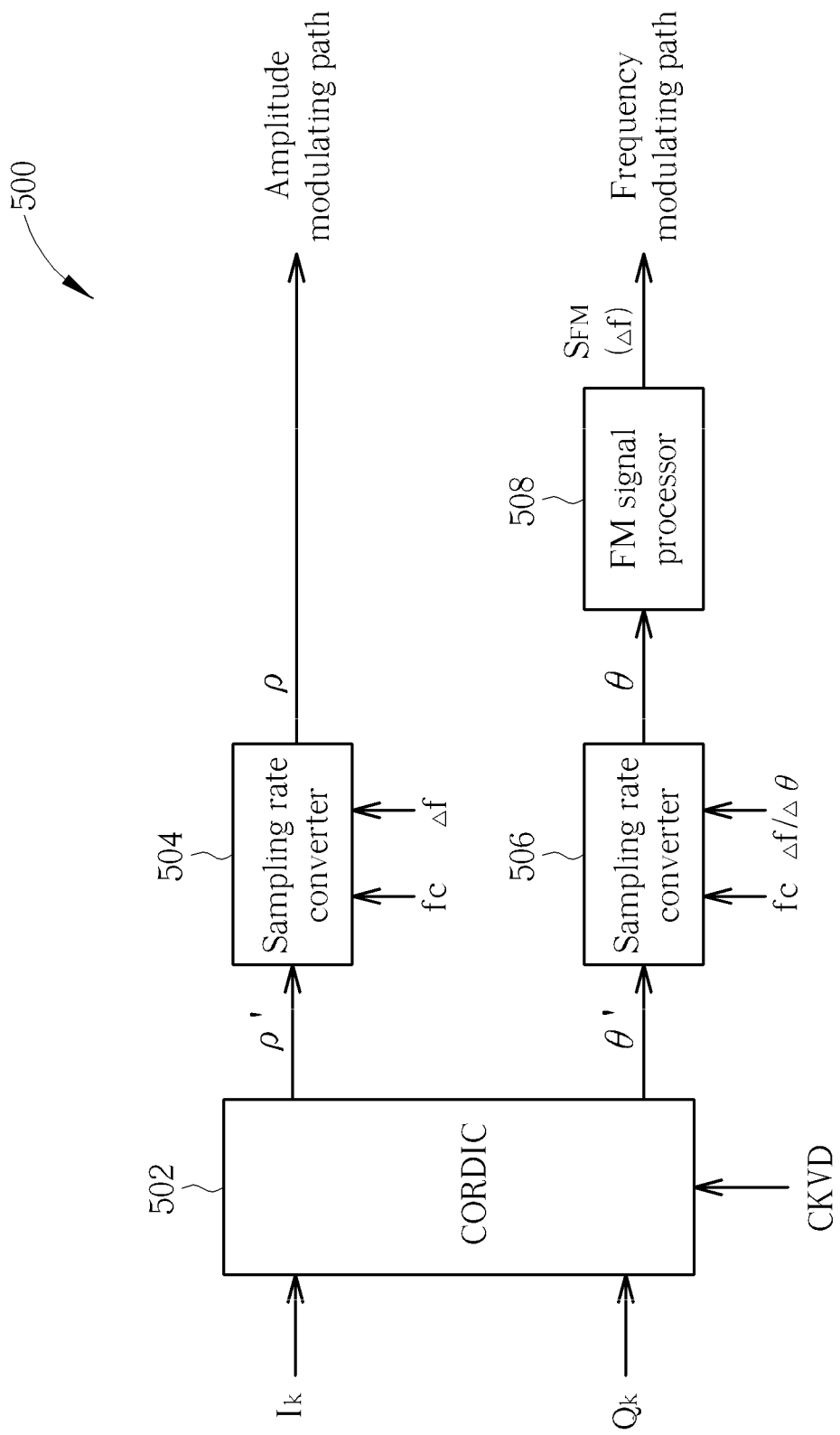
FIG. 5 is a diagram illustrating an alternative design of a digital processing block implemented in a polar transmitter according to an exemplary embodiment of the present invention.

In above embodiment, the sampling rate converter 112 is placed before the CORDIC 114. However, this is for illustrative purposes only, and is not meant to be a limitation of the present invention. FIG. 5 is a diagram illustrating an alternative design of a digital processing block implemented in a polar transmitter according to an exemplary embodiment of the present invention. The digital processing block 500 includes a CORDIC 502, a plurality of sampling rate converters 504, 506, and an FM signal processor 508. The CORDIC 502 is arranged for converting the in-phase component $I_k$ and the quadrature component $Q_k$ into a phase component $\theta'$ and an amplitude component $\rho'$. Each of the sampling rate converters 504 and 506 performs interpolation upon its inputs according to the carrier frequency $f_c$ and the frequency deviation $\Delta f$ the frequency modulated clock CKV. Hence, the sampling rate converter 504 generates the high-rate amplitude component $\rho$ to the amplitude modulating path, and the sampling rate converter 506 generates the high-rate phase component $\theta$ to the FM signal processor 508. The FM signal processor 508 is arranged for converting the phase component $\theta$ into the frequency deviation $\Delta f$, which is the differentiation of the phase with respect to time, and accordingly generating the frequency modulating signal $S_{FM}$. It should be noted that the output of the digital processing block 500 may be substantially identical to that of the digital processing block 102. Similarly, as the rate conversion ratio of each of the sampling rate converters 504 and 506 is dynamically adjusted/updated to compensate the frequency deviation effect, the frequency modulating signal $S_{FM}$ in FIG. 5 is therefore adjusted for frequency deviation of the frequency modulated clock CKV.

Briefly summarized, the digital processing block 102/500 with simplified digital correction may use a linear interpolator with an $\alpha$ weighting factor. The weighting factor $\alpha$ defines where to estimate the value on a linearly interpolated line. In addition, the $\alpha$ weighting factor is responsive to the carrier frequency and the frequency deviation of the frequency modulated clock, and uses a multiplication operator.

Functional accuracy of the TX circuits using the variable-rate clocks derived from the DCO clock can be affected by the frequency deviation. Thus, besides the CORDIC mentioned above, other circuit components may also require compensation for the frequency deviation. For example, an ADPLL in a conventional polar transmitter is also affected by frequency deviation of the DCO clock. Specifically, the frequency command word (FCW) data fed into the ADPLL is derived from CORDIC's digital output in each CORDIC cycle. As the CORDIC operates according to a variable-rate clock derived from the DCO clock, the CORDIC cycles change due to the DCO clock period variation. Hence, a fixed-rate clock may latch the FCW data after certain duration once the FCW data is changed, which causes some phase error and propagates into the following loop filter in the ADPLL. Sometimes, the fixed-rate clock may lose one FCW data if the frequency is large, which causes large phase error and degrades the frequency modulation quality. To solve these problems, the present invention therefore proposes a reference phase generator with clock interpolation in the compensating feed input.

Figure 9:
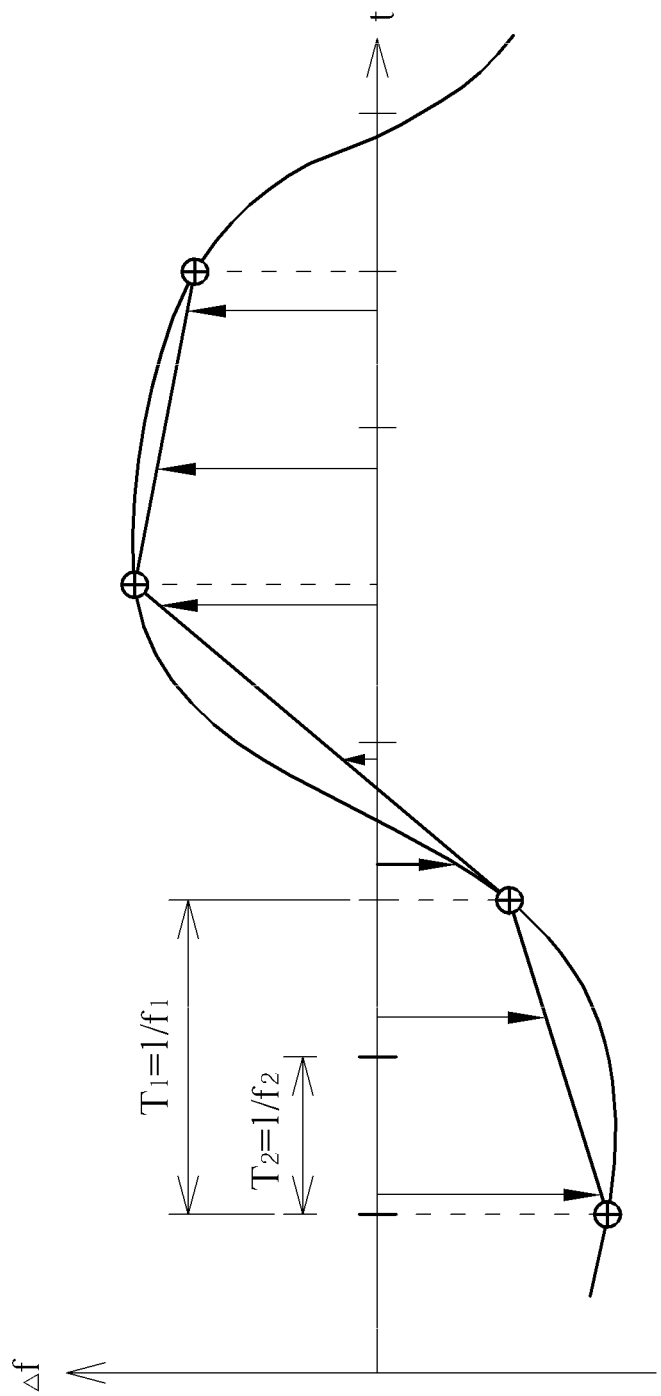
FIG. 9 is a diagram illustrating the linear interpolation in the sampling rate converter that is aware of the instantaneous frequency deviation of the variable clock.

The proposed idea is further illustrated in FIG. 9 for the sampling rate converter 506 operating on the phase/frequency deviation samples. It can be applied conceptually to the other types of sampling rate converters, such as 504, 112, 204. The ideal modulating data is a continuous-time thick curve $\Delta f(t)$, which is the phase $\theta$ differentiated with respect to time. The modulating data samples at the fixed clock rate $f_1$ (i.e., equidistant clock timestamps), shown as circles, are linearly interpolated to the variable clock timestamps, shown as vertical arrows. For illustration purposes, the average variable frequency $f_2$ is exactly twice of $f_1$. In the negative $\Delta f$ region, the variable samples are delayed versus their average (i.e., unmodulated) locations, while in the positive $\Delta f$ region, the variable samples are advanced. The linear interpolation accounts for the timing shifts of the variable timestamps. For illustration purposes, the samples are not dense enough; hence the linear interpolation error appears much higher than normally expected.

Figure 6:
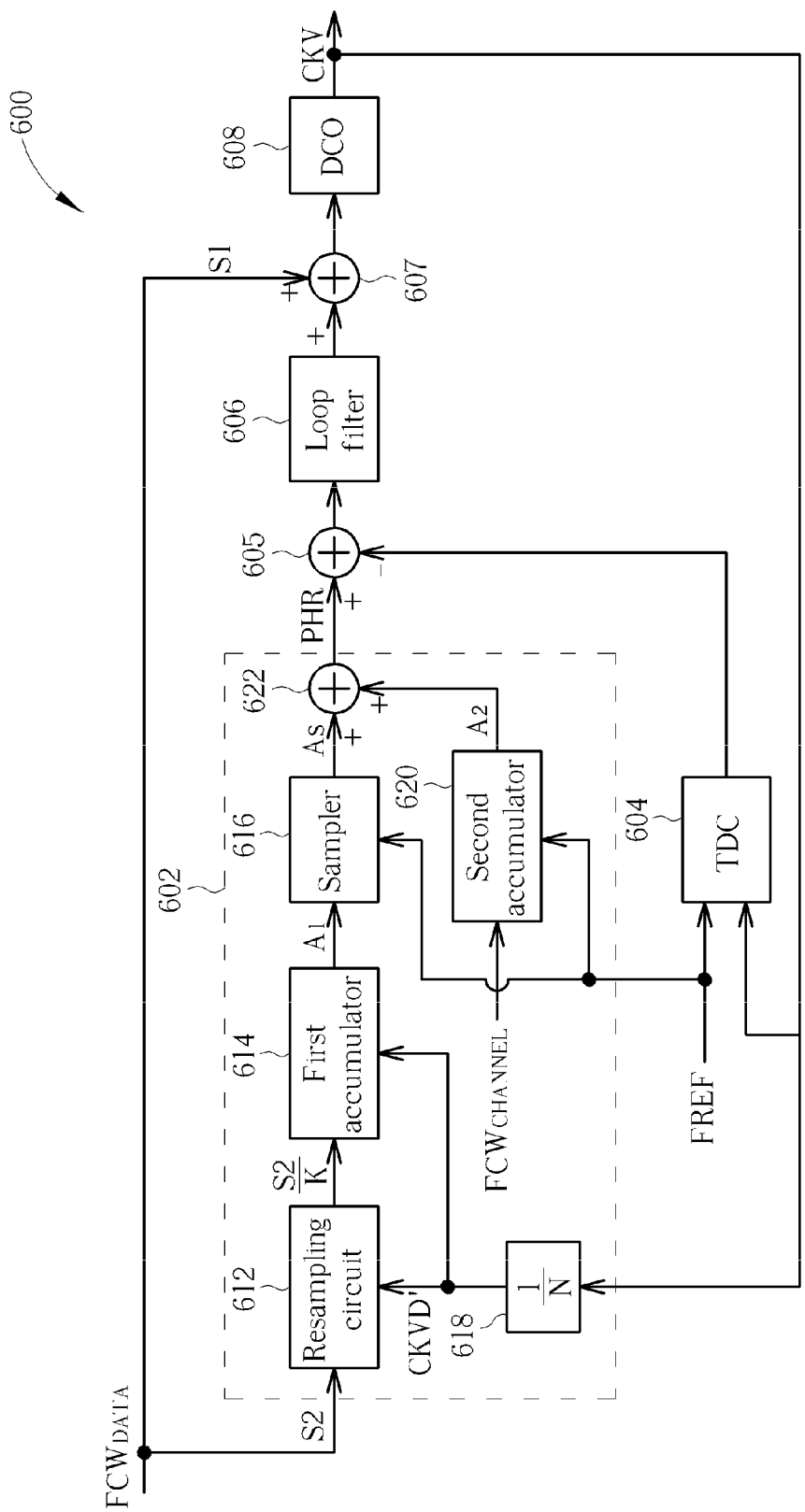
FIG. 6 is a diagram illustrating an ADPLL employing a reference phase generator according to an exemplary embodiment of the present invention.

Please refer to FIG. 6, which is a diagram illustrating an ADPLL according to an exemplary embodiment of the present invention. By way of example, the ADPLL 118 shown in FIG. 1 may be implemented using the ADPLL 600 shown in FIG. 6. However, this is not meant to be a limitation of the present invention. Any electronic device (e.g., a digital polar transmitter) using the ADPLL 600 shown in FIG. 6 falls within the scope of the present invention. The ADPLL 600 employs a two-point all-digital frequency modulator architecture, and includes a direct feed input S1, a compensating feed input S2, a reference phase generator 602, a time-to-digital converter (TDC) 604 that features an extended range through counting of the CKV periods, a loop filter 606, a DCO 608, and adders 605 (actually a subtractor, which is realized as an adder whose lower input is negated), 607. The direct feed input S1 and the compensating feed input S2 are derived from a first frequency command word (FCW) input $FCW_{DATA}$ at a first clock rate (e.g., CKV/48, a.k.a., CKVD48) since the first FCW input $FCW_{DATA}$ is obtained from the digital output of the CORDIC operating at the first clock rate (e.g., CKV/48). The direct feed input S1 is arranged for directly modulating frequency of an oscillator (e.g., DCO 608). The compensating feed input S2 is arranged for compensating effects of the frequency modulation on a phase error (i.e., output of adder 605), and is resampled by a specific clock CKVD' that is an integer edge division of a clock output of the oscillator (e.g., DCO 608). Specifically, the frequency of the specific clock CKVD' is higher than the frequency of the compensating feed input S2, and the sampling rate of the direct feed input S1 is lower than the frequency of the specific clock CKVD'. Besides, as the direct feed input S1 is derived from the digital output of the CORDIC operating at a variable-rate clock derived from the clock output of the oscillator (e.g., DCO 608), samples of the direct feed input S1 are synchronous to the oscillator (e.g., DCO 608).

In this embodiment, the compensating feed input S2 is resampled by performing a linear interpolation, where the compensating feed input S2 is resampled by the specific clock CKVD' to produce a plurality of samples, and the samples are further sampled by a frequency reference clock FREF. As shown in FIG. 6, the reference phase generator 602 is employed to process the compensating feed input S2 and generate a reference phase output PHR. The reference phase generator 602 includes a resampling circuit 612, a first accumulator 614, a sampler 616, a clock divider 618, a second accumulator 620, and an adder 622. The clock divider 618 performs an integer edge division of the frequency modulated clock CKV generated from the DCO 608, and provides the specific clock CKVD' to the resampling circuit 612 and the first accumulator 614. For example, the first FCW input $FCW_{DATA}$ is generated at an input clock rate CKV/48, and the specific clock CKVD' is set by a clock rate CKV/6 (a.k.a., CKVD6). Hence, the specific clock CKVD' (e.g., CKV/6) is synchronous with the data input clock (e.g., CKV/48), and the specific clock CKVD' has a higher frequency. The resampling circuit 612 is arranged for receiving the first FCW input $FCW_{DATA}$, and resampling the first FCW input $FCW_{DATA}$ by the specific clock CKVD' to produce a plurality of samples S2/K. More specifically, the resampling circuit 612 evenly divides one digital value DV of the first FCW input $FCW_{DATA}$ in one CORDIC cycle into K subcells each having a value equal to DV/K. The first accumulator 614 is coupled to the resampling circuit 612, and arranged for accumulating the incoming samples S2/K according to the specific clock CKVD' to generate a first accumulated result $A_1$. More specifically, the first accumulator 614 uses a higher clock rate to accumulate the samples derived from the first FCW input $FCW_{DATA}$ having a lower clock rate. The sampler 616 is coupled to the first accumulator 614, and arranged for sampling the first accumulated result $A_1$ according to a frequency reference clock FREF with a fixed reference frequency $f_{REF}$, and accordingly generating a sampled result $A_S$ to the adder 622 for updating the reference phase output PHR.

Figure 7:
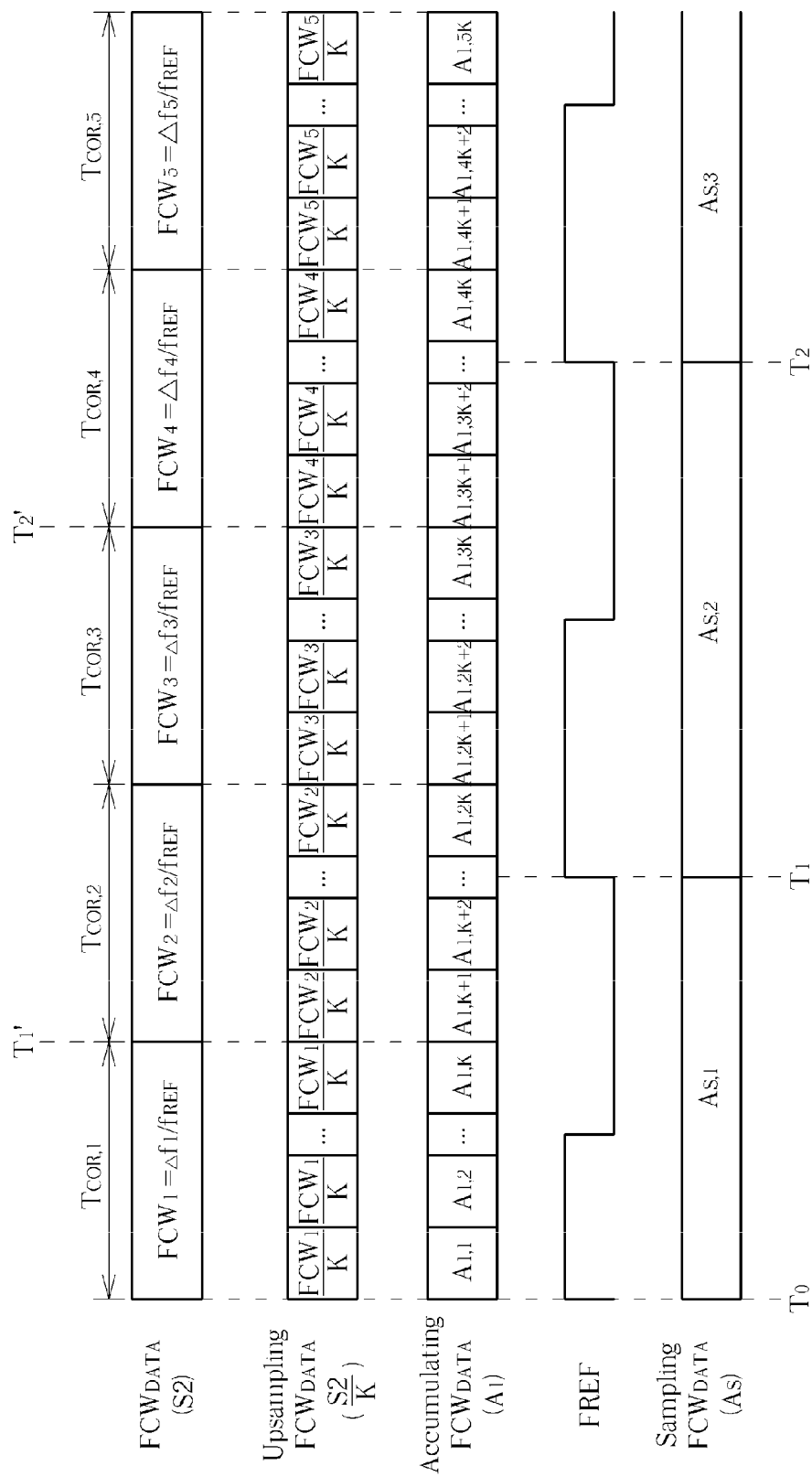
FIG. 7 is a diagram illustrating an example of generating a sampled output by using the resampling circuit, the first accumulator and the sampler shown in FIG. 6.

Please refer to FIG. 7 in conjunction with FIG. 6. FIG. 7 is a diagram illustrating an example of generating a sampled output by using the resampling circuit 612, the first accumulator 614 and the sampler 616 shown in FIG. 6. As shown in FIG. 7, successive digital values $FCW_1$-$FCW_5$ of the first FCW input $FCW_{DATA}$ are transmitted during successive CORDIC cycles $T_{COR,1}$-$T_{COR,5}$, respectively. In this example, each of the CORDIC cycles $T_{COR,1}$-$T_{COR,5}$ have 48 CKV cycles. It should be noted that the CORDIC cycles $T_{COR,1}$-$T_{COR,5}$ may have different lengths due to frequency deviation of the frequency modulated clock CKV. The resampling circuit 612 evenly divides each digital value in one CORDIC cycle into K subcells. Taking the first digital value $FCW_1$ in the first CORDIC cycle $T_{COR,1}$ for example, each subcell/sample would have the value equal to $FCW_1/K$. In other words, the sum of all K subcells/samples, each having the value of $FCW_1/K$, would be equal to the digital value $FCW_1$.

The first accumulator 614 accumulates the samples $FCW_1/K$, $FCW_2/K$, $FCW_3/K$, $FCW_4/K$, $FCW_5/K$ generated from the preceding resampling circuit 612. In this example, the first accumulated result $A_{1,1}$ is equal to $FCW_1/K$, the first accumulated result $A_{1,2}$ is equal to $A_{1,1}+FCW_1/K$ (i.e., $A_{1,2}=2*FCW_1/K$), and the first accumulated result $A_{1,K}$ is equal to $A_{1,K-1}+FCW_1/K$ (i.e., $A_{1,K}=K*FCW_1/K=FCW_1$). The first accumulated result $A_{1,K+1}$ is equal to $A_{1,K}+FCW_2/K$ (i.e., $A_{1,K+1}=FCW_1+FCW_2/K$), the first accumulated result $A_{1,K+2}$ is equal to $A_{1,K+1}+FCW_2/K$ (i.e., $A_{1,K+2}=FCW_1+2*FCW_2/K$), and the first accumulated result $A_{1,2K}$ is equal to $A_{1,2K-1}+FCW_2/K$ (i.e., $A_{1,2K}=FCW_1+K*FCW_2/K=FCW_1+FCW_2$). As a person skilled in the art can readily deduce values of the following first accumulated results $A_{1,2K+1}-A_{1,5K}$ by analogy, further description is omitted here for brevity.

Suppose that the sampler 616 is triggered/clocked by rising edges of the frequency reference clock FREF. At time $T_0$, the current output of the first accumulator 614 is therefore sampled by the sampler 616 to act as the sampled result $A_{S,1}$. At time $T_1$, the current output of the first accumulator 614 is therefore sampled by the sampler 616 to act as the sampled result $A_{S,2}$. At time $T_2$, the current output of the first accumulator 614 is therefore sampled by the sampler 616 to act as the sampled result $A_{S,3}$.

Regarding the conventional ADPLL design, the rising edge of the frequency reference clock FREF at time $T_1$ would sample and output the digital value $FCW_2$, and the next rising edge of the frequency reference clock FREF at time $T_2$ would sample and output the digital value $FCW_4$. However, there is a duration $(T_1-T_1')$ after the digital value $FCW_1$ is changed to the digital value $FCW_2$ at time $T_1'$, and there is a duration $(T_2-T_2')$ after the digital value $FCW_3$ is changed to the digital value $FCW_4$ at time $T_2'$. Hence, the conventional ADPLL design fails to capture the precise phase information at the sampling timing, resulting in uncompensated phase error propagated into the following loop filter. In contrast to the conventional ADPLL design, the proposed ADPLL design is capable of capturing the phase information with reduced error at the sampling timing through accumulating samples derived from resampling the original FCW data with a lower clock rate (e.g., CKV/48) by a synchronous clock with a higher clock rate (e.g., CKV/6) and sampling on rising edges of the frequency reference clock FREF. Besides, the conventional ADPLL design successively outputs digital values $FCW_2$ and $FCW_4$, thus losing the compensating reference phase information given by the digital value $FCW_3$ between the digital values $FCW_2$ and $FCW_4$. In contrast to the conventional ADPLL design, the proposed ADPLL design does not lose any digital value transmitted by the first FCW input $FCW_{DATA}$ due to the fact that consecutive samples will be accumulated. For example, the first accumulated result $A_{1,3K+1}$ is equal to $A_{1,3K}+FCW_4/K$ (i.e., $FCW_1+FCW_2+FCW_3+FCW_4/K$), and the phase information given by the digital value $FCW_3$ preceding the current the digital value $FCW_4$ is included in the first accumulated result $A_{1,3K+1}$ due to accumulation. It should be noted that the final FREF sampling may be asynchronous so that the resulting one CKVD' clock period uncertainty does not matter.

Please refer to FIG. 6 again. The reference phase generator 602 has the second accumulator 620 arranged for receiving a second FCW input $FCW_{CHANNEL}$ (e.g., $f_c/f_{REF}$), and accumulating the second FCW input $FCW_{CHANNEL}$ according to the frequency reference clock FREF to output a second accumulated result $A_2$ to the adder 622. For example, an increment $f_c/f_{REF}$ is added to/combined with the second accumulated result $A_2$ each time the second accumulator 620 is triggered/clocked by the rising edge of the frequency reference clock FREF. The adder 622 is coupled to the second accumulator 620 and the sampler 616, and arranged for generating the reference phase output PHR by adding the sampled result $A_S$ to the second accumulated result $A_2$. The reference phase output PHR and the output of the TDC 604 are combined at the subtracting adder 605, and an output of the adder 605 is fed into the loop filter 606. An output of the loop filter 606 and the direct feed input S1 are combined at the adder 607, and an output of the adder 607 acts as a digital control value of the frequency modulated clock CKV generated from the DCO 608. As details of adders 605, 607, loop filter 606, DCO 608 and TDC 604 are readily known to those skilled in the pertinent art, further description is omitted here for brevity.

It should be noted that the configuration shown in FIG. 6 is for illustrative purposes only, and is not meant to be a limitation of the present invention. In an alternative design, a retimed frequency reference clock may be used to take place of the frequency reference clock FREF used by the sampler 616 and the second accumulator 620. For example, the retimed frequency reference clock may be derived from sampling the frequency reference clock FREF by rising edges of the frequency modulated clock CKV. The sampled result $A_S$ obtained under the use of the retimed frequency reference clock is approximately the same as the sampled result $A_S$ obtained under the use of the frequency reference clock FREF. The same objective of providing improvement to the compensating feed path is achieved.

Figure 8:
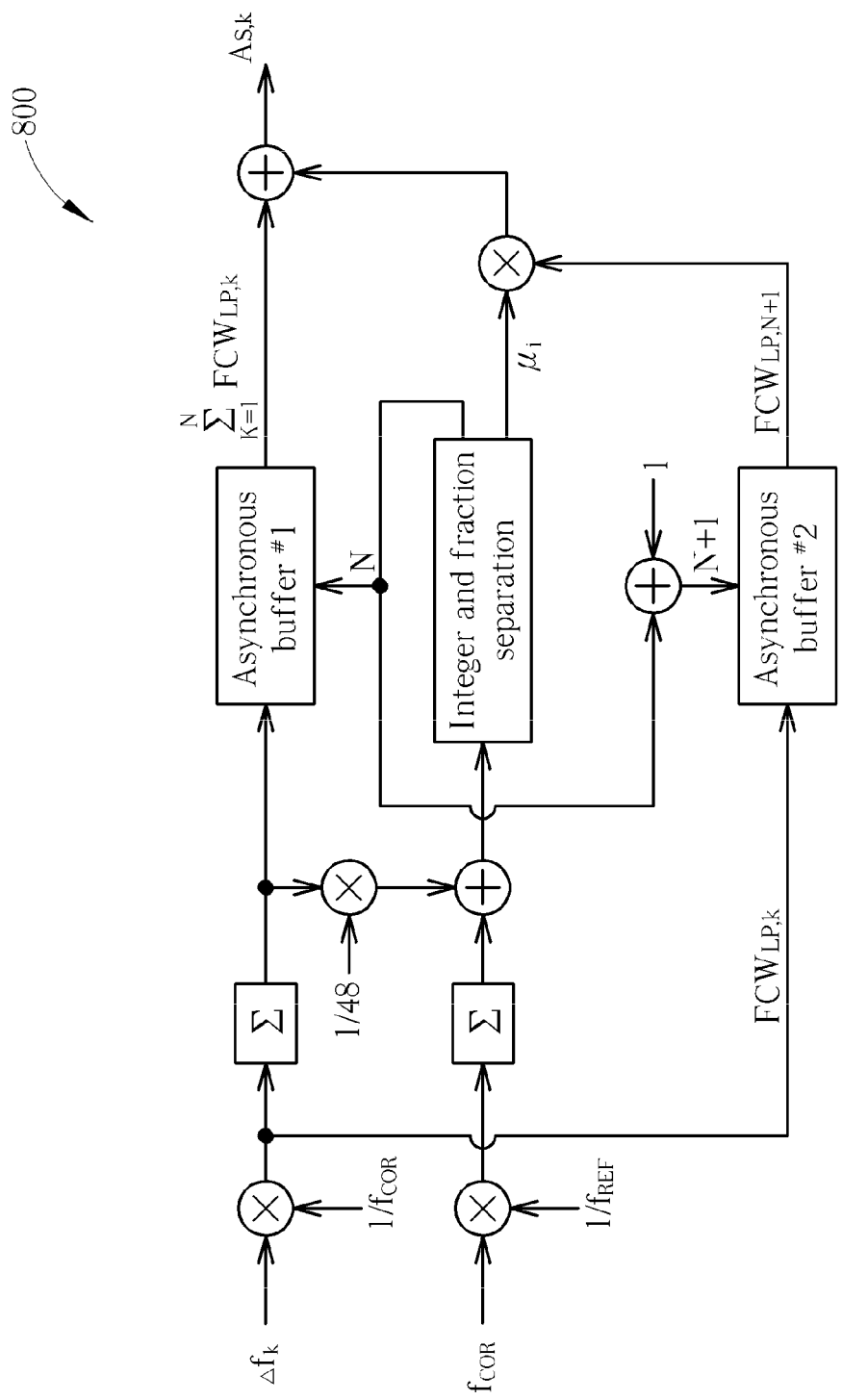
FIG. 8 is a diagram illustrating a computation circuit which may replace the resampling circuit, the first accumulator and the sampler shown in FIG. 6 according to an exemplary embodiment of the present invention.

In above exemplary design shown in FIG. 6, the phase information with reduced phase error at the sampling timing is obtained through accumulating samples derived from resampling the original FCW data by a synchronous clock with a higher clock rate and sampling on the frequency reference clock FREF. In an alternative design, the phase information with reduced phase error at the sampling timing may be obtained through direct computation. For example, the combination of resampling circuit 612, first accumulator 614 and sampler 616 may be replaced by a computation circuit 800 shown in FIG. 8. A varied-rate linear interpolation is applied here to compensate the frequency deviation of the frequency modulated clock CKV. For example, the varied-rate can be calculated based on the sampled variable phase. The phase information $A_{S,K}$ with reduced phase error at the sampling index k may be directly calculated through following equations.

$$\mu_i = i \times \frac{f_{COR}}{f_{REF}} - N \quad (5)$$

$$FCW_{LP,k} = \frac{\Delta f_k}{f_{COR}} \quad (6)$$

$$A_{S,k} = \sum_{k=1}^{N} \frac{\Delta f_k}{f_{COR}} + \mu_i \frac{\Delta f_{N+1}}{f_{COR}} = \sum_{k=1}^{N} FCW_{LP,k} + \mu_i FCW_{LP,N+1} \quad (7)$$

Briefly summarized, in the polar transmitter modulator clocked by the down-divided DCO clock, the time-variant clocks due to the frequency modulation cause the transmitter performance degradation. Regarding the conventional polar transmitter design, the replicas and spurs present in the RF output are channel dependent and related to the integer division ratio. Regarding the proposed polar transmitter design, these frequency deviations are compensated without degrading the transmitter performance. Specifically, the present invention proposes using a sampling rate converter which can take this frequency deviation into the interpolator and give an exact rate conversion ratio, and/or using a reference phase generator which helps to resample and accumulate the FM samples by a higher frequency synchronous clock and eliminate the asynchronous problem created from the interface between the frequency modulated clock CKV generated from the DCO and the frequency reference clock FREF.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A polar transmitter, comprising:
    a frequency modulating path, arranged for generating a frequency modulated clock in response to a frequency modulating signal;
    a clock divider, coupled to said frequency modulated clock, said clock divider arranged for generating a down-divided clock; and
    a digital processing block, coupled to said down-divided clock, said digital processing block arranged for generating said frequency modulating signal, and receiving a value of deviation possessed by said frequency modulating signal to adjust said frequency modulating signal, wherein said deviation is one of frequency deviation and phase deviation, said frequency modulating signal is adjusted for frequency deviation of said frequency modulated clock, and said frequency deviation of said frequency modulated clock results from said frequency deviation of said frequency modulating signal, wherein said digital processing block uses an interpolator with a weighting factor, said weighting factor is responsive to a carrier frequency and said frequency deviation of said frequency modulated clock, and said weighting factor is derived from rounding an accumulation of a rate conversion ratio.

2. The polar transmitter of claim 1, further comprising:
    an amplitude modulating path, coupled to said frequency modulated clock.

3. The polar transmitter of claim 1, wherein said digital processing block adjusts said frequency modulating signal by performing an interpolation from a fixed frequency clock to said down-divided clock.

4. The polar transmitter of claim 1, wherein said clock divider performs division by a power-of-two number.

5. The polar transmitter of claim 1, wherein said weighting factor uses a multiplication operator.

6. The polar transmitter of claim 1, wherein said digital processing block comprises:
    a digital signal processor, arranged for converting an in-phase component and a quadrature component into a phase component and an amplitude component;
    a sampling rate converter, wherein said frequency modulating signal is adjusted through said sampling rate converter to compensate for said frequency deviation of said frequency modulated clock; and
    a frequency modulated (FM) signal processor, arranged for generating said frequency modulating signal.

7. The polar transmitter of claim 6, wherein said sampling rate converter comprises:
    a rate conversion ratio generator, arranged for receiving a carrier frequency and said value of said deviation of said frequency modulating signal, and dynamically adjusting the rate conversion ratio according to said carrier frequency and said value; and
    an interpolation circuit, coupled to said rate ratio generator, said interpolation circuit arranged for performing interpolation according to said adjusted rate conversion ratio.

8. The polar transmitter of claim 7, wherein said interpolation circuit is a linear interpolator.

9. The polar transmitter of claim 7, wherein said interpolation circuit performs said interpolation according to an accumulation of said adjusted rate conversion ratio.

10. The polar transmitter of claim 1, wherein said frequency modulating path is an all-digital phase-locked loop (ADPLL).

11. The polar transmitter of claim 10, wherein said ADPLL employs a two-point modulation.

12. The polar transmitter of claim 1, wherein said adjusting for frequency deviation uses a look-up table.

13. A method for polar transmission, comprising:
    generating a frequency modulated clock in response to a frequency modulating signal;
    dividing a frequency of said frequency modulated clock to generate a down-divided clock; and
    generating said frequency modulating signal according to said down-divided clock, and receiving a value of deviation possessed by said frequency modulating signal to adjust said frequency modulating signal, wherein said deviation is one of frequency deviation and phase deviation, said frequency modulating signal is adjusted for frequency deviation of said frequency modulated clock, and said frequency deviation of said frequency modulated clock results from said frequency deviation of said frequency modulating signal, wherein said frequency modulating signal is generated by using an interpolation with a weighting factor, said weighting factor is responsive to a carrier frequency and said frequency deviation of said frequency modulated clock, and said weighting factor is derived from rounding an accumulation of a rate conversion ratio.

14. The method of claim 13, further comprising:
    generating an amplitude modulated output according to said frequency modulated clock.

15. The method of claim 13, wherein said frequency modulating signal is adjusted by performing an interpolation from a fixed frequency clock to said down-divided clock.

16. The method of claim 13, wherein said frequency of said frequency modulated clock is divided by a power-of-two number.

17. The method of 13, wherein said weighting factor uses a multiplication operator.

18. The method of claim 13, wherein generating said frequency modulating signal comprises:
    converting an in-phase component and a quadrature component into a phase component and an amplitude component;
    performing a sampling rate conversion, wherein said frequency modulating signal is adjusted through said sampling rate conversion to compensate for said frequency deviation of said frequency modulated clock; and
    generating said frequency modulating signal by frequency modulated (FM) signal processing.

19. The method of claim 18, wherein performing said sampling rate conversion comprises:
    receiving a carrier frequency and said value of said deviation of said frequency modulating signal, and dynamically adjusting the rate conversion ratio according to said carrier frequency and said value; and
    performing an interpolation according to said adjusted rate conversion ratio.

20. The method of claim 19, wherein said interpolation is a linear interpolation.

21. The method of claim 19, wherein said interpolation is performed according to an accumulation of said adjusted rate conversion ratio.

22. The method of claim 13, wherein generating said frequency modulated clock is performed by an all-digital phase-locked loop (ADPLL).

23. The method of claim 22, wherein said ADPLL employs a two-point modulation.

24. The method of claim 13, wherein said adjusting for frequency deviation uses a look-up table.

* * * * *